(12) United States Patent
Sakurai et al.

(10) Patent No.: US 9,374,077 B2
(45) Date of Patent: Jun. 21, 2016

(54) SWITCH CIRCUIT, SEMICONDUCTOR DEVICE, AND BATTERY DEVICE

(71) Applicant: Seiko Instruments Inc., Chiba-shi, Chiba (JP)

(72) Inventors: Atsushi Sakurai, Chiba (JP); Hiroshi Saito, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 369 days.

(21) Appl. No.: 14/182,972

(22) Filed: Feb. 18, 2014

(65) Prior Publication Data

US 2014/0232345 A1 Aug. 21, 2014

(30) Foreign Application Priority Data

Feb. 20, 2013 (JP) .................................. 2013-031365

(51) Int. Cl.
*H02J 7/00* (2006.01)
*H03K 17/082* (2006.01)

(52) U.S. Cl.
CPC .......... *H03K 17/0822* (2013.01); *H02J 7/0034* (2013.01); *H02J 7/0068* (2013.01)

(58) Field of Classification Search
USPC ......................................................... 320/107
See application file for complete search history.

(56) References Cited

U.S. PATENT DOCUMENTS

2012/0056592 A1* 3/2012 Sakurai ................. H02J 7/0034
320/134

FOREIGN PATENT DOCUMENTS

JP 2000-284843 A 10/2000

* cited by examiner

*Primary Examiner* — Eric Lee
(74) *Attorney, Agent, or Firm* — Brinks Gilson & Lione

(57) ABSTRACT

There is provided a semiconductor device capable of preventing the passage of current that is unexpected in a circuit operation even in the case of reverse connection, thus ensuring higher safety. The semiconductor device has a switch circuit which includes: a first transistor; a second transistor having a drain thereof connected to a drain of the first transistor, a source and a back gate thereof connected to a back gate of the first transistor, and a gate thereof connected to a source of the first transistor; and a third transistor having a drain thereof connected to the source of the first transistor, a source and a back gate thereof connected to the back gate of the first transistor, and a gate thereof connected to the drain of the first transistor.

4 Claims, 4 Drawing Sheets

SWITCH CIRCUIT, SEMICONDUCTOR DEVICE, AND BATTERY DEVICE

RELATED APPLICATIONS

This application claims priority under 35 U.S.C. §119 to Japanese Patent Application No. 2013-031365 filed on Feb. 20, 2013, the entire content of which is hereby incorporated by reference.

BACKGROUND OF THE INVENTION

1. Field of the Invention

The present invention relates to a switch circuit and a semiconductor device.

2. Background Art

FIG. 4 is a circuit diagram illustrating a conventional voltage controller. The conventional voltage controller is constituted of a voltage detector circuit 503, a positive power supply connection terminal 509 providing a positive power supply of the voltage detector circuit 503, a negative power supply connection terminal 510 providing a negative power supply of the voltage detector circuit 503, a control circuit 508 connected between the positive power supply connection terminal 509 and the negative power supply connection terminal 510, an N-ch transistor 501 having a gate thereof connected to an output of the control circuit 508, a drain thereof connected to an output terminal 511, and a source and a back gate thereof connected to the negative power supply connection terminal 510, and a resistor 512.

The control circuit 508 is constituted of a reference voltage generating circuit 506, resistors 504 and 505, which divide a voltage between the positive power supply connection terminal 509 and the negative power supply connection terminal 510 (the voltage between the positive power supply connection terminal and the negative power supply connection terminal will be hereinafter referred to as "the supply voltage"), and a comparator 507, which compares the voltage divided by the resistors 504 and 505 with a voltage of the reference voltage generating circuit 506. A parasitic diode 502 exists between the drain and the back gate of the N-ch transistor 501. The N-ch transistor 501 will act as a switch circuit of the voltage detector circuit 503.

Connecting the positive power supply connection terminal 509 and the output terminal 511 of the voltage detector circuit 503 and connecting one terminal of the resistor 512 thereto, and connecting the other terminal of the resistor to the positive power supply of a voltage generator 513 constitute the voltage controller, which controls the supply voltage of the voltage detector circuit 503 to a constant level.

A description will now be given of the operation. The supply voltage of the voltage detector circuit 503 is controlled to a voltage obtained by dividing the voltage of the voltage generator 513 by the resistance value of the resistor 512 connected to the positive power supply connection terminal 509 and an ON resistance value of the N-ch transistor 501. If the supply voltage of the voltage detector circuit 503 changes to a higher level, then the voltage divided by the resistors 504 and 505 increases to the voltage of the reference voltage generating circuit 506 or more, and the output of the control circuit 508 increases the gate voltage of the N-ch transistor 501. As the gate voltage increases, the ON resistance value of the N-ch transistor 501 decreases, thus decreasing the voltage between the output terminal 511 and the negative power supply connection terminal 510. The output terminal 511 is connected to the positive power supply connection terminal 509, so that the supply voltage of the voltage detector circuit 503 is also controlled to decrease. If the supply voltage of the voltage detector circuit 503 changes to a lower level, then the ON resistance value of the N-ch transistor 501 increases and the supply voltage of the voltage detector circuit 503 is controlled to increase, which is opposite from the foregoing case. Repeating the foregoing operation causes the voltage controller to operate to continue outputting a constant voltage (refer to, for example, FIG. 1 in Patent Document 1).

[Patent Document 1] Japanese Patent Application Laid-Open No. 2000-284843

However, according to the conventional voltage controller, if the positive power supply connection terminal 509 and the negative power supply connection terminal 510 of the voltage detector circuit 503 are inversely connected to a positive power supply terminal and a negative power supply terminal of the voltage generator 513 (hereinafter referred to as "reverse connection"), then the parasitic diode 502 of the N-ch transistor 501 of the switch circuit will be in the forward direction, because the positive power supply connection terminal 509 and the output terminal 511 are connected. As a result, current that is unexpected in the circuit operation flows through the voltage detector circuit 503. There has been a problem in that the passage of much current that is unexpected in the circuit operation tends to lead to heat generation or ignition, causing deteriorated safety of the voltage controller.

SUMMARY OF THE INVENTION

The present invention has been made with a view toward solving the problem described above and an object of the invention is to achieve a voltage controller capable of preventing the passage of current that is unexpected in a circuit operation even in the case of reverse connection, thus ensuring higher safety.

To this end, a switch circuit according to the present invention is configured as follows.

The switch circuit includes: a first transistor; a second transistor having a drain thereof connected to a drain of the first transistor, a source and a back gate thereof connected to a back gate of the first transistor, and a gate thereof connected to a source of the first transistor; and a third transistor having a drain thereof connected to the source of the first transistor, a source and a back gate thereof connected to the back gate of the first transistor, and a gate thereof connected to the drain of the first transistor.

According to the present invention, the voltage of the back gate of an N-ch transistor of the switch circuit connected to an output terminal is changed according to a connection state, namely, normal connection or reverse connection. This makes it possible to short-circuit the anode and the cathode of a parasitic diode, which is in a forward direction regardless of the connection state, thereby turning the diode off The present invention makes it possible to advantageously prevent, even in the case of reverse connection, the passage of current that is unexpected in a circuit operation.

DETAILED DESCRIPTION OF THE PREFERRED EMBODIMENTS

The following will describe embodiments of the present invention with reference to the accompanying drawings.

First Embodiment

Figure 1:
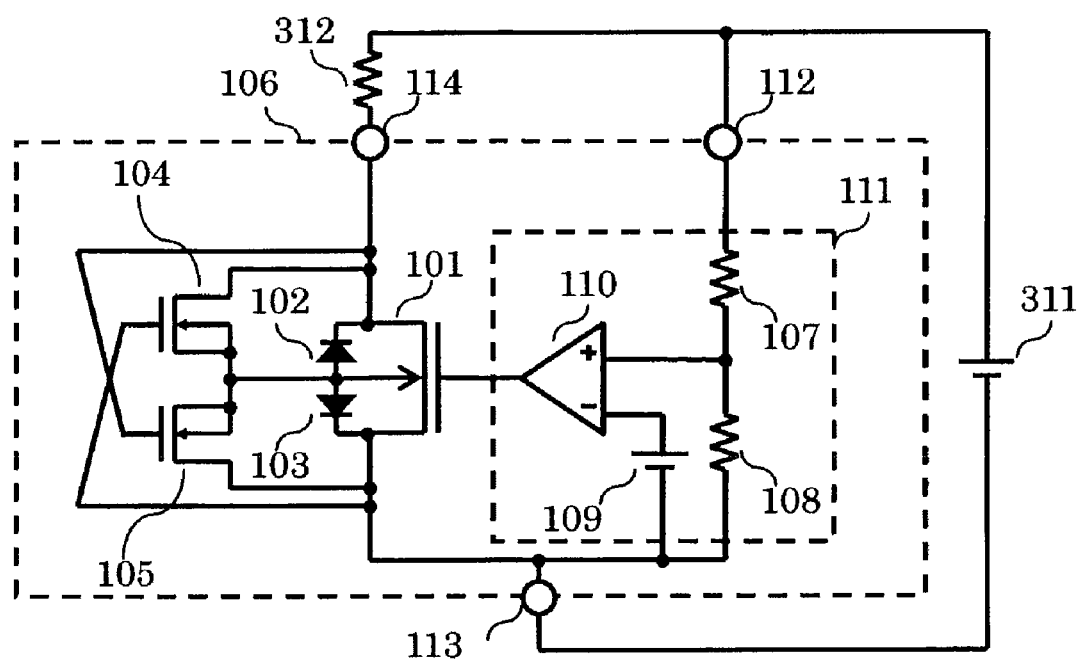
FIG. 1 is a circuit diagram of a voltage detector provided with a switch circuit according to an embodiment of the present invention.

FIG. 1 is a circuit diagram of a voltage detector provided with a switch circuit according to a first embodiment. The voltage detector provided with the switch circuit according to the present embodiment is constituted of a voltage detector circuit 106, a positive power supply connection terminal 112, a negative power supply connection terminal 113, an output terminal 114 and a control circuit 111 of the voltage detector circuit 106, a switch circuit comprised of N-ch transistors 101, 104 and 105, and a pull-up resistor 312. Resistors 107 and 108, a reference voltage generating circuit 109, and a comparator 110 constitute the control circuit 111.

A non-inverting input terminal of the comparator 110 is connected to a connection point of the resistors 107 and 108, an inverting input terminal thereof is connected to the reference voltage generating circuit 109, and an output terminal thereof is connected to the gate of the N-ch transistor 101. The other terminal of the resistor 108 is connected to the negative power supply connection terminal 113, while the other terminal of the resistor 107 is connected to the positive power supply connection terminal 112. The other terminal of the reference voltage generating circuit 109 is connected to the negative power supply connection terminal 113. One terminal of the pull-up resistor 312 is connected to the output terminal 114, while the other terminal thereof is connected to the positive power supply connection terminal 112. The N-ch transistor 101 of the switch circuit has a source thereof connected to the negative power supply connection terminal 113 and a drain thereof is connected to the positive power supply connection terminal 112. The N-ch transistor 104 has a gate thereof connected to the source of the N-ch transistor 101, a drain thereof connected to the drain of the N-ch transistor 101, and a source and a back gate thereof connected to a back gate of the N-ch transistor 101. The N-ch transistor 105 has a gate thereof connected to the drain of the N-ch transistor 101, a drain thereof connected to the source of the N-ch transistor 101, and a source and a back gate thereof connected to the back gate of the N-ch transistor 101. A parasitic diode 102 exists between the back gate and the drain of the N-ch transistor 101, and a cathode of the parasitic diode 102 is connected to the drain of the N-ch transistor 101, while an anode thereof is connected to the back gate of the N-ch transistor 101. A parasitic diode 103 exists between the back gate and the source of the N-ch transistor 101, and a cathode of the parasitic diode 103 is connected to the source of the N-ch transistor 101, while an anode thereof is connected to the back gate of the N-ch transistor 101.

A description will now be given of the operation of the voltage detector provided with the switch circuit of the present embodiment.

If a voltage generator 311 is in normal connection with the positive power supply connection terminal 112 and the negative power supply connection terminal 113, which function also to monitor voltages and if the voltage of the voltage generator 311 is not more than a predetermined voltage set by the voltage detector circuit 106, then the N-ch transistor 101 is turned off by the control circuit 111, and the voltage of the output terminal 114 is set to a positive voltage of the voltage generator 311 by the pull-up resistor 312. If the voltage of the voltage generator 311 reaches a predetermined voltage, which is set by the voltage detector circuit 106, or more, then the N-ch transistor 101 is turned on by the control circuit 111 and the voltage of the output terminal 114 becomes a negative voltage of the voltage generator 311. Thus, the voltage detector operates to be capable of detecting that the voltage generator 311 has reached a predetermined voltage.

At this time, the direction of the parasitic diode 103 of the N-ch transistor 101 of the switch circuit of the voltage detector circuit 106 is the forward direction. However, the N-ch transistor 105 turns on, so that the parasitic diode 103 is short-circuited, thus preventing the passage of current that is unexpected in the circuit operation. If the positive power supply connection terminal 112 and the negative power supply connection terminal 113 of the voltage detector circuit 106 are inversely connected to the positive power supply terminal and the negative supply terminal of the voltage generator 311, then the direction of the parasitic diode 102 of the N-ch transistor 101 of the switch circuit becomes the forward direction. However, the N-ch transistor 104 turns on, so that the parasitic diode 102 is short-circuited, thus preventing the passage of current that is unexpected in the circuit operation.

Therefore, the N-ch transistor 104 or 105 of the switch circuit turns on according to the connection state, causing the parasitic diode in the forward direction to be short-circuited. This makes it possible to prevent the passage of current that is unexpected in the circuit operation even in the case of the reverse connection.

In the present embodiment, the N-ch transistors 101, 104 and 105 have been used in describing the switch circuit. Alternatively, however, P-ch transistors may be used, and the transistors used are not limited to those in the present embodiment. Further, the control circuit 111 is not limited to the one used in the present embodiment.

As described above, the voltage detector provided with the switch circuit according to the present embodiment is capable of preventing the passage of current that is unexpected in a circuit operation regardless whether a voltage generator, such as a secondary battery, is in normal connection or reverse connection, thus ensuring higher safety.

Second Embodiment

Figure 2:
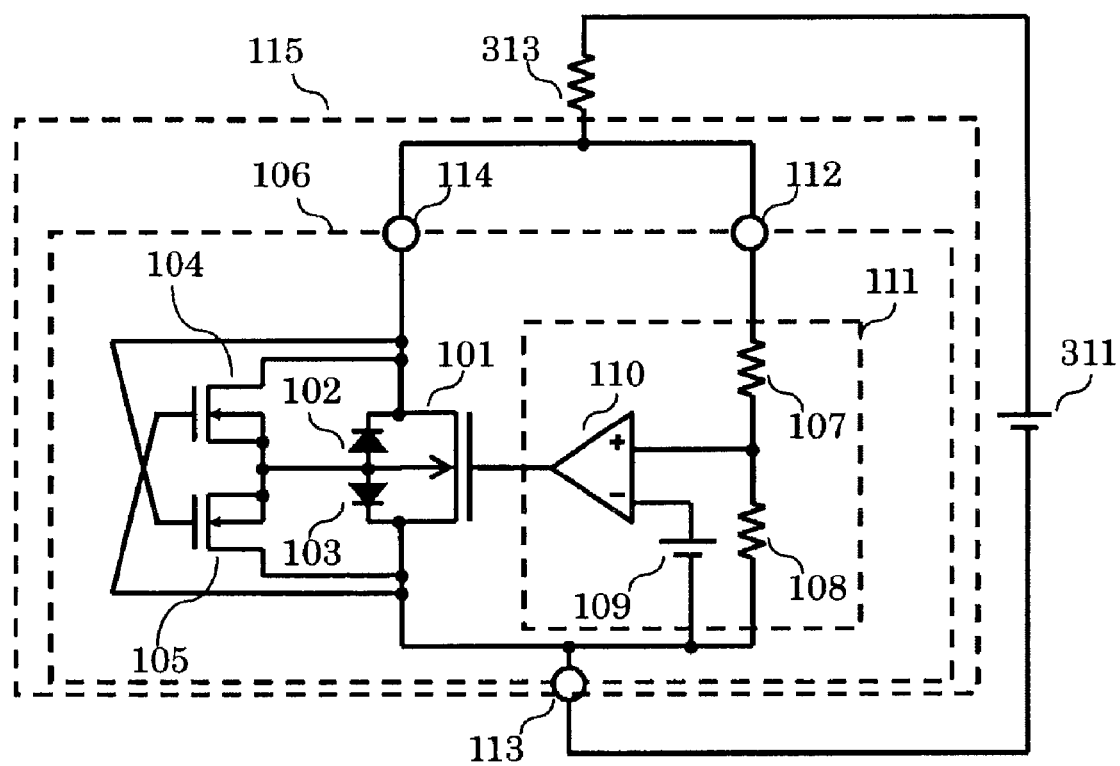
FIG. 2 is a circuit diagram of a voltage controller provided with a switch circuit according to another embodiment of the present invention.

FIG. 2 is a circuit diagram of a voltage controller provided with a switch circuit according to a second embodiment. A voltage detector circuit 106 becomes a voltage control circuit that monitors the voltage between the drain and the source of an N-ch transistor 101 to control the N-ch transistor 101, when a positive power supply connection terminal 112 and an output terminal 114 are connected. Further, one terminal of a resistor 313 is connected to the positive power supply connection terminal 112 and the output terminal 114, while the other terminal of the resistor 313 is connected to the positive power supply of a voltage generator 311. The voltage controller operates with the configuration described above.

A description will now be given of the operation of the voltage controller provided with the switch circuit according to the present embodiment.

The supply voltage of the voltage control circuit 115 is controlled to a voltage obtained by dividing the voltage of the voltage generator 311 by the resistance value of the resistor 312 and the ON resistance value of the N-ch transistor 101. If the supply voltage of the voltage control circuit 115 changes to a higher level, then the voltage divided by resistors 107 and 108 reaches the voltage of a reference voltage generating circuit 109 or higher, and the output of the control circuit 111 increases the gate voltage of the N-ch transistor 101. As the gate voltage increases, the ON resistance value of the N-ch transistor 101 decreases, thus decreasing the voltage between the output terminal 114 and a negative power supply connection terminal 113. The output terminal 114 is connected to the positive power supply connection terminal 112, so that the supply voltage of the voltage control circuit 115 is also controlled to decrease. If the supply voltage of the voltage control circuit 115 changes to a lower level, then the ON resistance value of the N-ch transistor 101 increases and the supply voltage of the voltage control circuit 115 is controlled to increase, which is opposite from the foregoing case. Repeating the foregoing operation causes the voltage controller to operate to continue outputting a constant voltage. At this time, an N-ch transistor 104 is off, while an N-ch transistor 105 is on, and a parasitic diode 103 in the forward direction is short-circuited, thus preventing the passage of current that is unexpected in the circuit operation. Thus, the passage of current that is unexpected in the circuit operation is prevented by the N-ch transistor 105 of the switch circuit in the case of the normal connection.

If a voltage generator 311 is inversely connected between the positive power supply connection terminal 112 and the negative power supply connection terminal 113, then the N-ch transistor 104 of the switch circuit turns on, while the N-ch transistor 105 thereof turns off. This causes a parasitic diode 102 in the forward direction to be short-circuited, thus making it possible to prevent the passage of current that is unexpected in the circuit operation.

Hence, the N-ch transistor 104 or 105 of the switch circuit turns on according to the connection state, causing the parasitic diode in the forward direction to be short-circuited. Thus, the passage of current that is unexpected in the circuit operation can be prevented even in the case of reverse connection.

In the present embodiment, the N-ch transistors 101, 104 and 105 have been used in describing the switch circuit. Alternatively, however, P-ch transistors may be used, and the transistors used are not limited to those in the present embodiment. Further, the control circuit 111 is not limited to the one used in the present embodiment.

As described above, the voltage controller provided with the switch circuit according to the present embodiment is capable of preventing the passage of current that is unexpected in a circuit operation regardless of normal connection or reverse connection, thereby ensuring higher safety.

Third Embodiment

Figure 3:
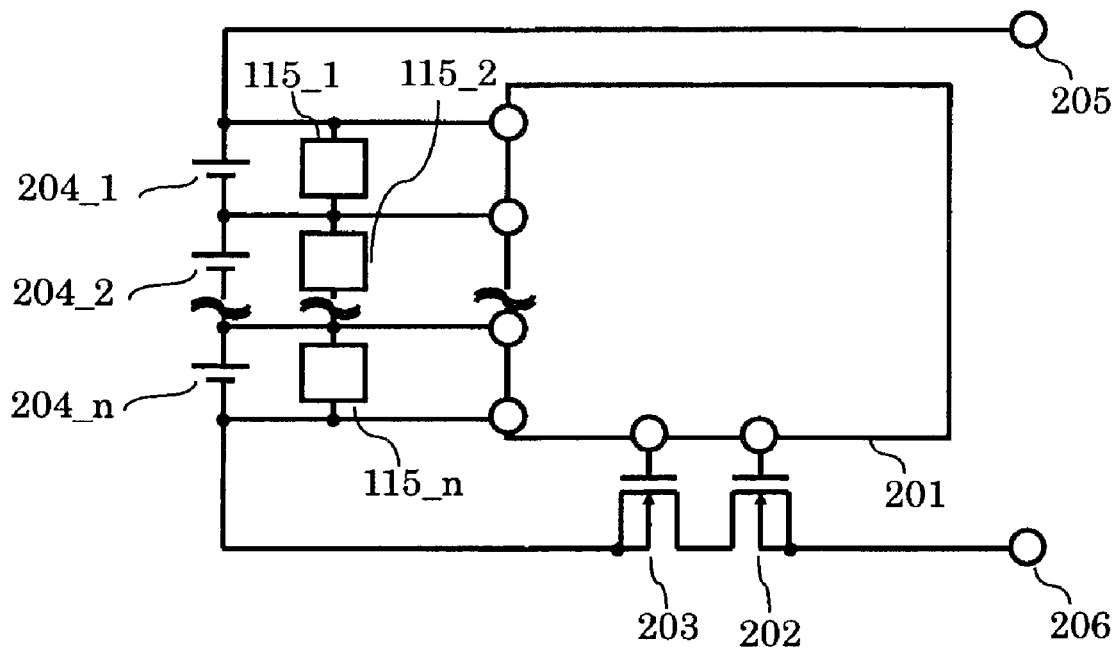
FIG. 3 is a circuit diagram of a battery device provided with a switch circuit according to yet another embodiment of the present invention.
Figure 4:
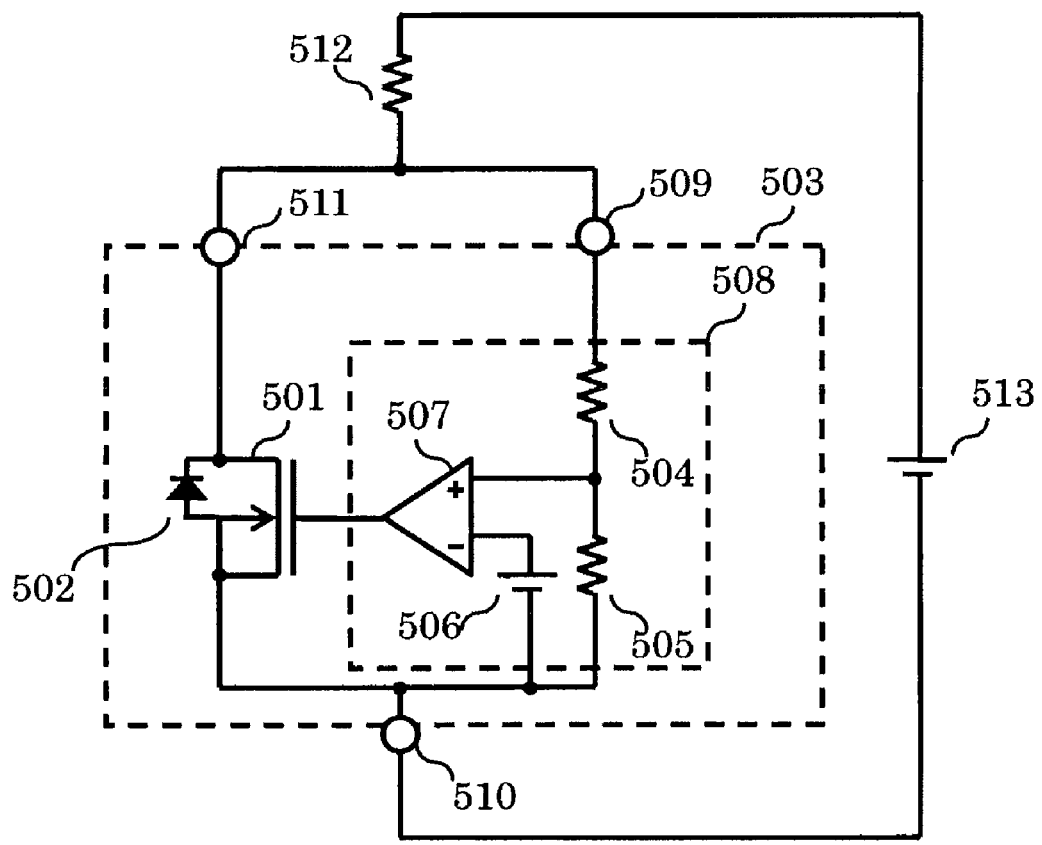
FIG. 4 is a circuit diagram of a conventional voltage controller.

FIG. 3 is a circuit diagram of a battery device provided with a switch circuit according to the present embodiment.

The battery device includes a plurality of secondary batteries 204_1 to 204_n connected in series, a plurality of voltage control circuits 115_1 to 115_n connected in series, a charge/discharge control circuit 201, a discharge control N-ch FET transistor 203, and a charge control N-ch FET transistor 202. All the voltage control circuits 115_1 to 115_n have the same configuration as that of the voltage control circuit 115.

The secondary battery 204_1 and the voltage control circuit 115_1 are connected in parallel and connected to input terminals of the charge/discharge control circuit 201. In the case of normal connection, a positive power supply terminal of the secondary battery 204_1 is connected to a positive power supply connection terminal 112 of the voltage control circuit 115_1, while a negative power supply terminal thereof is connected to a negative power supply connection terminal 113 of the voltage control circuit 115_1. The same connection applies to the secondary batteries 204_2 to 204_n and the voltage control circuits 115_2 to 115_n. The discharge control N-ch FET transistor 203 and the charge control N-ch FET transistor 202 are connected to the charge/discharge control circuit 201 so as to be controlled to turn on/off.

A description will now be given of the operation of the battery device provided with the switch circuit according to the present embodiment.

If the charge/discharge control circuit 201 detects that the voltages of the secondary batteries 204_1 to 204_n charged by a voltage generator, such as a charger, connected between an external terminal 205 and an external terminal 206 reach a predetermined voltage, which is set by the charge/discharge control circuit 201, or higher, then the charge/discharge control circuit 201 turns off the charge control N-ch FET transistor 202 to interrupt charging current. Further, if the charge/discharge control circuit 201 detects that the voltages of the secondary batteries 204_1 to 204_n discharged by a load, such as a resistor, connected between the external terminal 205 and the external terminal 206 have reduced to another predetermined voltage, which is set by the charge/discharge control circuit 201, or lower, then the charge/discharge control circuit 201 turns off the discharge control N-ch FET transistor 203 to interrupt discharging current.

If the voltage control circuits 115_1 to 115_n detect that the voltages of the secondary batteries 204_1 to 204_n charged by a voltage generator, such as a charger, connected between the external terminal 205 and the external terminal 206 reaches a predetermined voltage, which is set in the voltage control circuits 115_1 to 115_n, or higher, then the voltage control circuits 115_1 to 115_n turns on an N-ch transistor 101 so as to redirect the charging current, which is flowing to the secondary batteries 204_1 to 204_n, to the voltage control circuits 115_1 to 115_n. For example, if the voltage of the secondary battery 204_1 reaches the predetermined voltage, which is set in the voltage control circuit 115_1, or higher, then the N-ch transistor 101 of the voltage control circuit 115_1 connected in parallel turns on. When the N-ch transistor 101 turns on, the charging current flows to the N-ch transistor 101 but does not flow to the secondary battery 204_1. When the N-ch transistor 101 turns on and the ON resistance value of the N-ch transistor 101 decreases, the voltage of a positive power supply connection terminal 112 of the voltage control circuit 115_1 decreases and if the voltage of the positive power supply connection terminal 112 reduces to the predetermined voltage, which is set in the voltage control circuit 115_1, or lower, then the N-ch transistor 101 turns off. When the N-ch transistor 101 turns off and the ON resistance value of the N-ch transistor 101 increases, the voltage of the positive power supply connection terminal 112 of the voltage control circuit 115_1 is increased and reaches the voltage, which is set in the voltage control circuit 115_1, or higher. This causes the N-ch transistor 101 to turn on, redirecting the charging current again. The series of the foregoing operations is repeated to maintain the voltage of the secondary battery 204_1 to the predetermined voltage set in the voltage control circuit 115_1. If the secondary batteries 204_2 to 204_n are charged while the secondary battery 204_1 is holding the constant voltage, then the same operations as those of the secondary battery 204_1 will be performed. Setting the predetermined voltages to be set in the voltage control circuits 115_1 to 115_n to the same voltage holds all the voltages of the plurality of the secondary batteries 204_2 to 204_n connected in series at a constant voltage, thus maintaining a voltage balance. This arrangement enables the voltage control circuits 115_1 to 115_n to operate in the battery device as the voltage control circuits for accomplishing the voltage balance in the plurality of the secondary batteries connected in series.

When the secondary batteries 204_1 to 204_n are in normal connection, the direction of a parasitic diode 103 of the N-ch transistor 101 of the switch circuit becomes the forward direction. However, an N-ch transistor 105 turns on, enabling the voltage control circuits 115_1 to 115_n to prevent the passage of current that is unexpected in the circuit operation. If the voltage control circuits 115_1 to 115_n are inversely connected to a positive power supply terminal and a negative power supply terminal of the secondary batteries 204_1 to 204_n, then the direction of a parasitic diode 102 of the N-ch transistor 101 of the switch circuit becomes the forward direction. However, an N-ch transistor 104 turns on, thus making it possible to prevent the passage of current that is unexpected in the circuit operation. Hence, the N-ch transistor 104 or 105 of the switch circuit turns on according to the connection state, causing the parasitic diode in the forward direction to be short-circuited. This makes it possible to prevent the passage of current that is unexpected in the circuit operation even in the case of reverse connection.

The N-ch transistors 101, 104 and 105 have been used in describing the switch circuit. Alternatively, however, P-ch transistors may be used, and the transistors used are not limited to those in the present embodiment.

As described above, the battery device provided with the switch circuit according to the present embodiment is capable of controlling the voltage balance among a plurality of secondary batteries connected in series. Further, it is possible to provide a battery device capable of preventing the passage of current that is unexpected in a circuit operation regardless of whether secondary batteries are in normal connection or reverse connection, thus ensuring higher safety.

What is claimed is:

1. A switch circuit comprising:
    a first transistor;
    a second transistor having a drain thereof connected to a drain of the first transistor, a source and a back gate thereof connected to a back gate of the first transistor, and a gate thereof connected to a source of the first transistor; and
    a third transistor having a drain thereof connected to the source of the first transistor, a source and a back gate thereof connected to the back gate of the first transistor, and a gate thereof connected to the drain of the first transistor.

2. A semiconductor device comprising:
    a voltage control circuit having a control circuit which detects a voltage applied between a first voltage monitoring terminal and a second voltage monitoring terminal, and
    the switch circuit according to claim 1, in which the gate of the first transistor is connected to an output terminal of the control circuit, the drain thereof is connected to the first voltage monitoring terminal, and the source thereof is connected to the second voltage monitoring terminal.

3. A battery device comprising:
    a plurality of secondary batteries connected in series;
    a charge/discharge control switch provided on a charge/discharge path of the plurality of secondary batteries;
    a charge/discharge control circuit which monitors the voltages of the plurality of secondary batteries and controls the charge/discharge of the secondary batteries by opening/closing the charge/discharge control switch; and
    the semiconductor device according to claim 2, which is connected in parallel to each of the plurality of secondary batteries and which controls the voltages of the plurality of secondary batteries.

4. A semiconductor device comprising:
    a voltage detector circuit having a control circuit which detects a voltage applied between a first voltage monitoring terminal and a second voltage monitoring terminal, and
    the switch circuit according to claim 1, in which the gate of the first transistor is connected to an output terminal of the control circuit, the drain thereof is connected to the first voltage monitoring terminal through a resistor, and the source thereof is connected to the second voltage monitoring terminal.

* * * * *